(12) United States Patent
Singh et al.

(10) Patent No.: US 8,671,743 B2
(45) Date of Patent: Mar. 18, 2014

(54) TEST EQUIPMENT MANIFOLD INTERFACE

(75) Inventors: Bharathi Ranjit Singh, Petaling Jaya (MY); Azmi Rashid, Cheras (MY); Kathirawan Santhinan, Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 161 days.

(21) Appl. No.: 13/488,452

(22) Filed: Jun. 5, 2012

(65) Prior Publication Data

US 2013/0319098 A1 Dec. 5, 2013

(51) Int. Cl.
*G01M 19/00* (2006.01)

(52) U.S. Cl.
USPC ........................................................ 73/114.77

(58) Field of Classification Search
USPC .............................. 73/114.31, 114.32, 114.77
See application file for complete search history.

(56) References Cited

U.S. PATENT DOCUMENTS

| | | |
|---|---|---|
| 3,776,599 A | 12/1973 | Reuter |
| 5,254,310 A | 10/1993 | Bressan |
| 6,837,121 B2 * | 1/2005 | Sternberger et al. ....... 73/864.71 |
| 7,487,683 B2 | 2/2009 | Kato |
| 2004/0035191 A1 * | 2/2004 | Sternberger et al. ......... 73/64.56 |
| 2008/0267790 A1 | 10/2008 | Gaudet |

* cited by examiner

*Primary Examiner* — Eric S McCall
(74) *Attorney, Agent, or Firm* — Charles Bergere

(57) ABSTRACT

A test equipment manifold interface for automated test equipment (ATE) for testing electronic circuits by both Device Under Test Thermal Management (DTM) and non-DTM testing. The manifold interface has a housing, with an air inlet aperture, outlet apertures, and a chamber. The chamber has a chamber inlet provided by the air inlet aperture and a chamber outlet coupled to the outlet apertures. A hollow piston is captive in the chamber. The piston has DTM interface inlet and outlet apertures. In operation, when a DTM load board manifold engages the manifold interface, the hollow piston directs air to flow from the air inlet aperture to the DTM interface outlet aperture. When the DTM load board manifold disengages the manifold interface, the hollow piston directs air to flow from the air inlet to the outlet apertures via the chamber outlet.

20 Claims, 6 Drawing Sheets

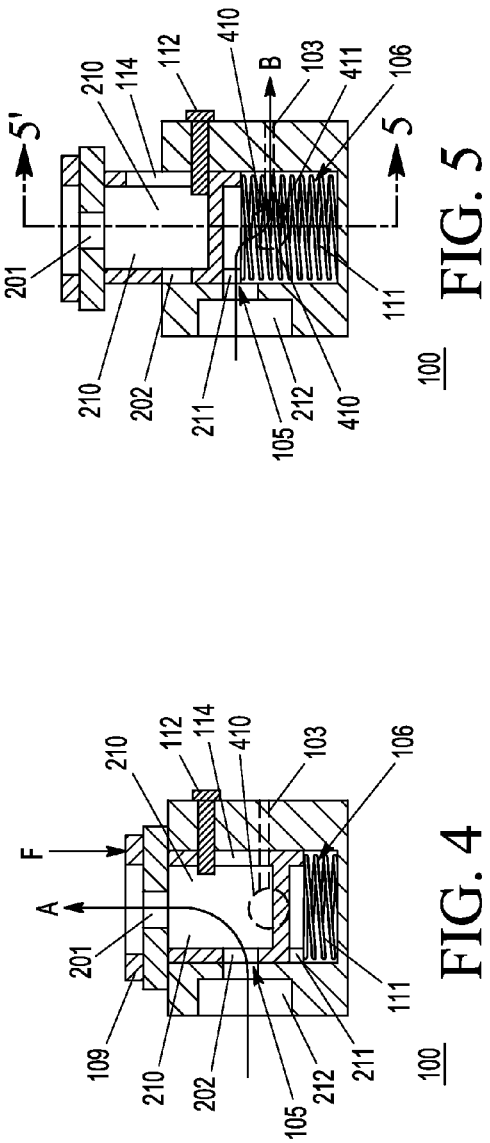
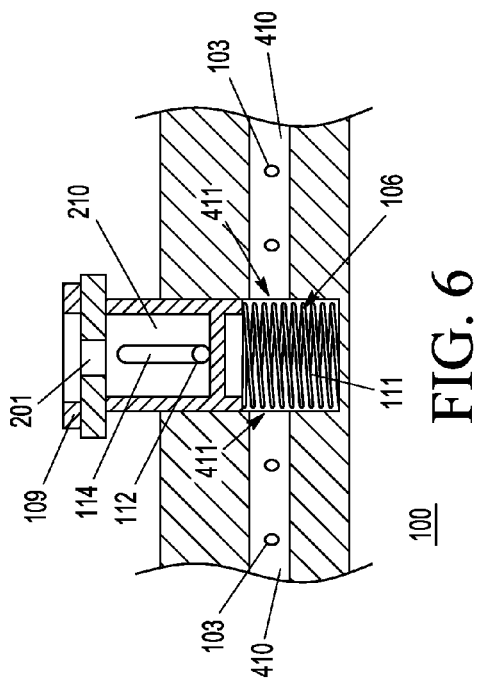

TEST EQUIPMENT MANIFOLD INTERFACE

BACKGROUND OF THE INVENTION

The present invention relates to integrated circuit (IC) test equipment and, more particularly, to a manifold interface for IC test equipment.

A load board is often used when testing an electronic device (device under test or DUT) such as packaged semiconductor chip or integrated circuit. The load board is essentially an interface board, similar to a circuit board, which provides an interface between test equipment (automatic test equipment or ATE) and the device or DUT.

When testing certain devices, thermal testing must be performed to determine if the DUT meets specific requirements or standards. During thermal testing, the DUT is subjected to varying temperatures to determine whether it can operate in varied ambient conditions. When Device Under Test Thermal Management (DTM) testing is performed, the DUT is mounted to a load board that has a manifold. The manifold engages with a manifold of the ATE and to accurately direct temperature controlled air at the DUT. This controlled air is typically directed to leads of each DUT that is mounted on the load board and allows for testing of each DUT when heated to a temperature associated with its temperature rating. For instance, DTM testing is suitable for devices that are subject to temperature extremes such as devices used near an engine of an automobile and therefore the directed air is often at temperatures of over 100° C.

If the DUT in not subject to such temperature extremes then non-DTM testing may be performed. When performing non-DTM testing, the load board does not have a manifold since heated temperature controlled air does not need to be accurately directed at the DUT. Hence, because test equipment is often required to perform both DTM and Non-DTM testing, the interface between the load-board and test equipment must be replaced when changing between DTM and non-DTM testing. This interface replacement can be a time consuming and costly exercise, resulting in unwanted test equipment down-time. Accordingly, it would be advantageous to be have an ATE with a manifold that can be readily replaced, changed, or interfaced with other devices or equipment.

BRIEF DESCRIPTION OF THE DRAWINGS

The invention, together with objects and advantages thereof, may best be understood by reference to the following description of preferred embodiments together with the accompanying drawings in which:

FIG. 4 is a cross-sectional view, through 3-3' of FIG. 3, with a hollow piston in a retracted position;

FIG. 5 is cross-sectional view, through 3-3' of FIG. 3, when the hollow piston is in an extended or protruding position.

FIG. 6 is a cross-sectional view, through 5-5' of FIG. 5;

DETAILED DESCRIPTION OF PREFERRED EMBODIMENTS

Figure 1:
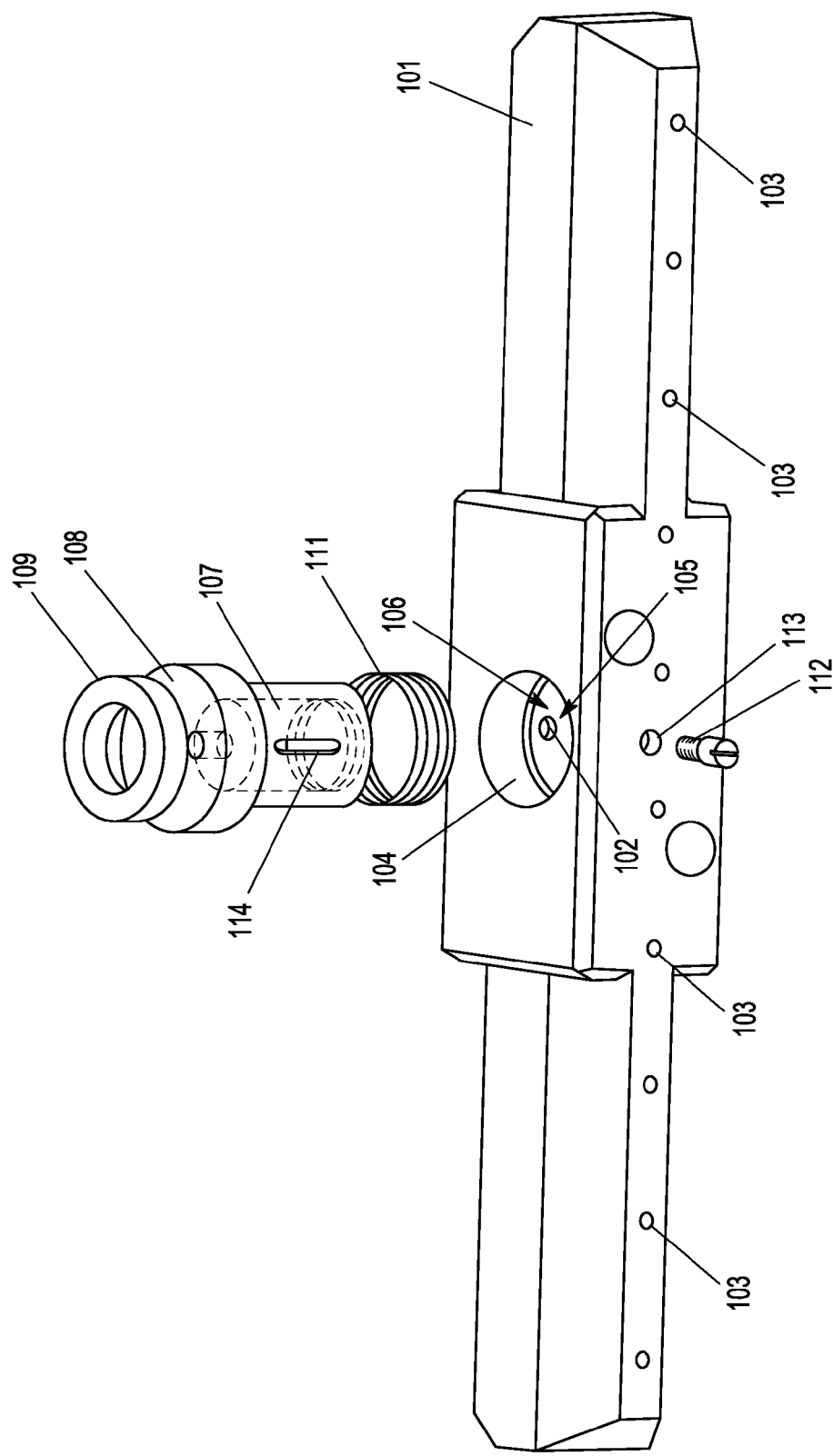
FIG. 1 is an exploded perspective view of a test equipment manifold interface viewed from a first side in accordance with a preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides for a test equipment manifold interface comprising a housing, an air inlet aperture in the housing and a plurality of outlet apertures in the housing. There is a chamber located in the housing. The chamber has a chamber inlet provided by the air inlet aperture and a chamber outlet coupled to the plurality of outlet apertures. A hollow piston is captive in the chamber. The hollow piston has a DTM interface outlet aperture and a DTM interface inlet aperture. In operation, when a DTM load board manifold engages the manifold interface, the hollow piston directs air to flow from the air inlet aperture to the DTM interface outlet aperture. When the DTM load board manifold disengages the manifold interface, the hollow piston directs air to flow from the air inlet to the plurality of outlet apertures via the chamber outlet.

In another embodiment the present invention provides for a test equipment assembly comprising a test equipment mount with at least one mount air outlet aperture. There is at least one test equipment manifold interface coupled to the test equipment mount. The manifold interface includes a housing, an air inlet aperture in the housing and a plurality of outlet apertures in the housing. There is a chamber located in the housing, the chamber has a chamber inlet provided by the air inlet aperture and a chamber outlet coupled to the plurality of outlet apertures. A hollow piston is captive in the chamber. The hollow piston has a DTM interface outlet aperture and a DTM interface inlet aperture. The air inlet aperture is operatively coupled to the mount air outlet aperture and in operation the hollow piston provides for selectively directing air from the air inlet aperture to either the DTM interface outlet aperture or the plurality of apertures.

Referring to FIG. 1 an exploded perspective view of a test equipment manifold interface 100 viewed from a first side in accordance with a preferred embodiment of the present invention is shown. The test equipment manifold interface 100 has a housing 101 and there is an air inlet aperture 102 in the housing 101. There is also a plurality of outlet apertures 103 in the housing 101 and a chamber 104 located in the housing 101. The chamber 104 has a chamber inlet 105 provided by an orifice of the air inlet aperture 102 and a chamber outlet 106 is coupled to the plurality of outlet apertures 103. There is a hollow piston 107 with a manifold abutting end 108 to which a gasket 109 is attached by an adhesive.

A compression spring 111 of a size (diameter) is provided that can be accommodated in the chamber 104. A retainer screw 112 operative couples with a threaded hole 113 in the housing 101 and the hollow piston 107 has a slot 114 for accommodating an end of the retainer screw 112.

Figure 2:
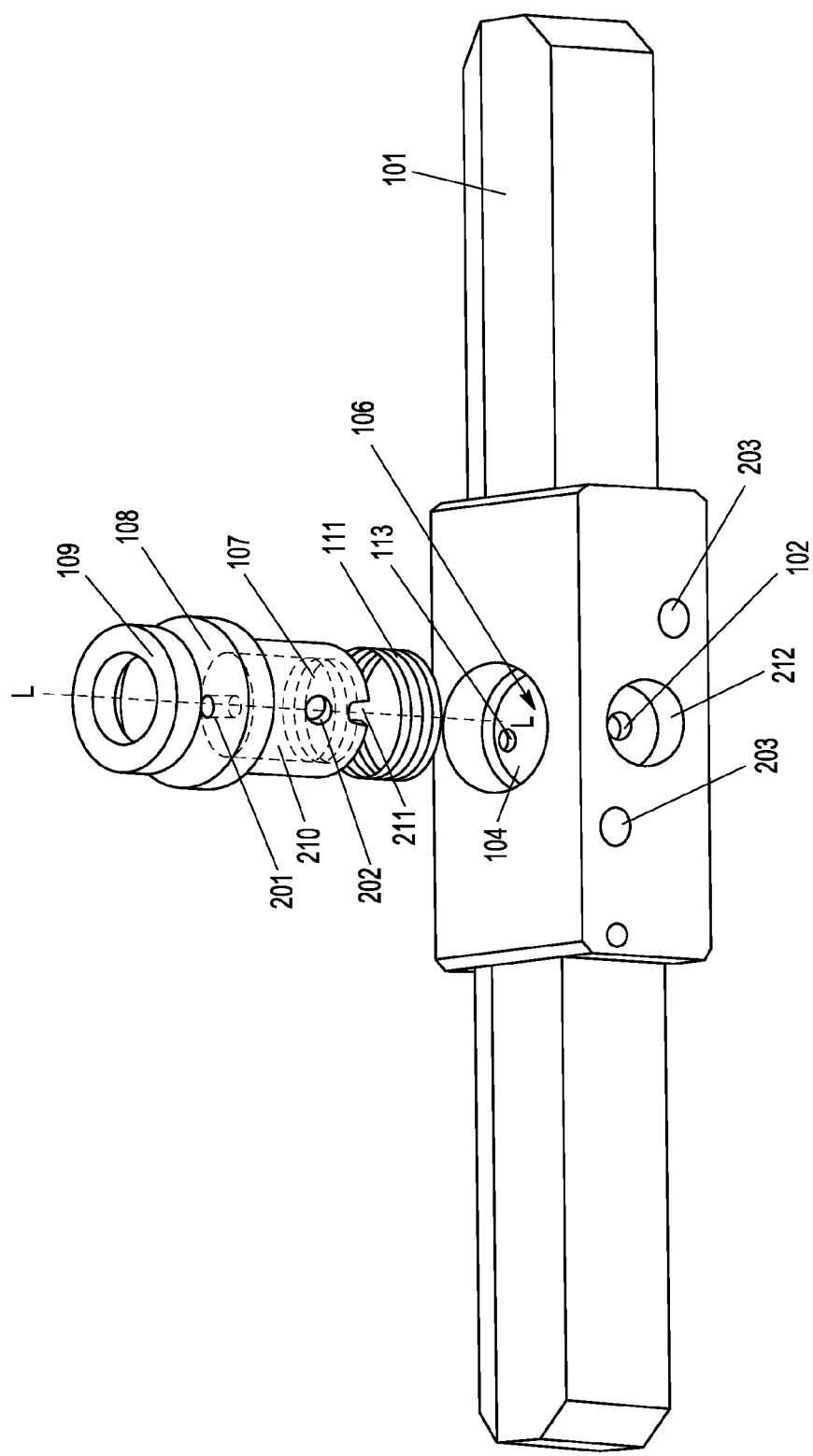
FIG. 2 is an exploded perspective view of the test equipment manifold interface of FIG. 1 when viewed from an opposite second side.

FIG. 2 is an exploded perspective view of the test equipment manifold interface 100 when viewed from an opposite second side. As illustrated, the hollow piston 107 has a DTM interface outlet aperture 201 and a DTM interface inlet aperture 202 operatively coupled together by a piston passage 210 in the hollow piston 107. The DTM interface outlet aperture 201 is in the manifold abutting end 108 of the hollow piston 107 and the DTM interface inlet aperture 202 is in a side wall of the hollow piston 107. There is also a notch 211 in the hollow piston 107, and the notch 211 is aligned with the DTM interface inlet aperture 202 along the axial length L-L' of the hollow piston 107. Also illustrated are guide pin apertures 203 for assisting in mounting and dismounting of the test equipment manifold interface 100 to a test equipment mount and there is also an interface socket 212 in the housing 101.

Figure 3:
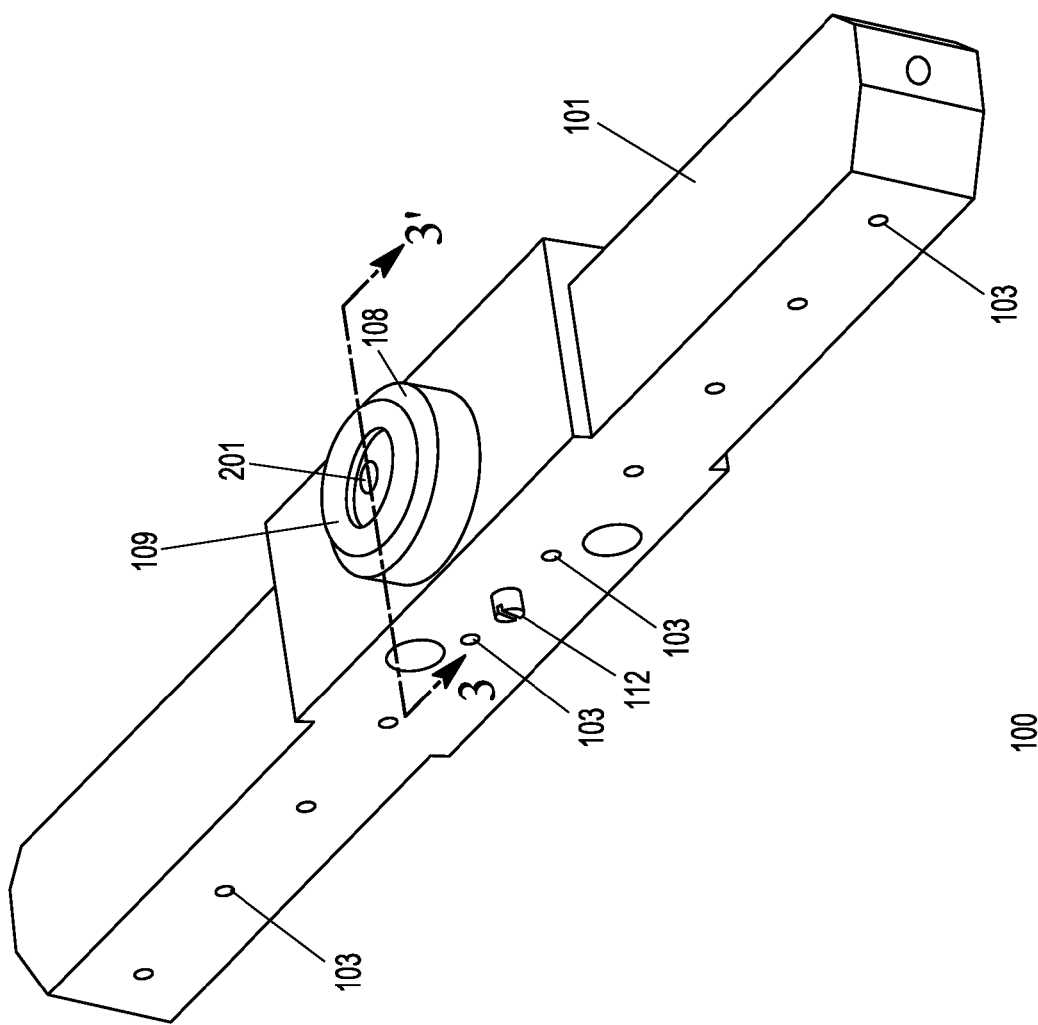
FIG. 3 is an assembled perspective view of the test equipment manifold interface of FIG. 1 viewed from view the first side.

FIG. 3 is an assembled perspective view of the test equipment manifold interface 100 viewed from view the first side. The hollow piston 107 is held captive in the chamber 104 by the retainer screw 112 engaging the slot 114, and the manifold abutting end 108 of the hollow piston 107 is in an extended position protruding out of the housing 101 at its maximum extended position allowed by the retainer screw 112 and slot 114.

FIG. 4 is a cross-sectional view, through 3-3' of FIG. 3, of the test equipment manifold interface 100 when the hollow piston 107 is in a retracted position. As shown, the compression spring 111 is located at a blank end of the chamber 104 which provides a biasing of the hollow piston 107 to an extended or protruding position. However, as illustrated, the hollow piston 107 is located in a retracted position due to a force, illustrated by an arrow F, applied to gasket 109 in which the force overcomes the biasing of the compression spring 111.

When the hollow piston 107 is in this retracted position, the DTM interface inlet aperture 202 is aligned with the chamber inlet 105 and thus air from the air inlet aperture 102 can pass through the DTM interface inlet aperture 202, through the piston passage 210 in the hollow piston 107 and out of the DTM interface outlet aperture 201. The flow of air supplied from the inlet aperture 102, when the hollow piston 107 is in the retracted position, is illustrated by an arrow A. Furthermore, as will be apparent to a person skilled in the art the chamber outlet 106 is an area proximal to at least one feeder passage 410 in the housing 101, wherein the feeder passage 410 is operatively coupled to the outlet apertures 103. More specifically, the chamber outlet 106 is area proximal to the feeder passage 410 and includes an orifice 411 of the feeder passage 410.

Referring to FIG. 5, another cross-sectional view, through 3-3' of FIG. 3, of the test equipment manifold interface 100 when the hollow piston 107 is in an extended or protruding position is shown. The hollow piston 107 is in the extended or protruding position because there is no counteracting force overcoming the biasing of the compression spring 111. In this position the DTM interface inlet aperture 202 is misaligned with the chamber inlet 105 and therefore air cannot flow from the air inlet aperture 102, through the piston passage 210 and out of the DTM interface outlet aperture 201. Instead, the notch 211 is aligned with the chamber inlet 105 and thus air from the air inlet aperture 102 is directed into the chamber outlet 106 along at least one feeder passage 410 and to the outlet apertures 103. The flow of air supplied from the inlet aperture 102, when the hollow piston 107 is in the extended or protruding position, is illustrated by an arrow B. Hence, as will be apparent to a person skilled in the art, the hollow piston 107 is biased by the compression spring 111 to direct air to the outlet apertures 103.

Referring to FIG. 6 there is illustrated a cross sectional view, through 5-5' of FIG. 5, of the test equipment manifold interface 100. This illustration shows the relationship of the feeder passage 410 to the chamber 104 and outlet apertures 103.

Figure 7:
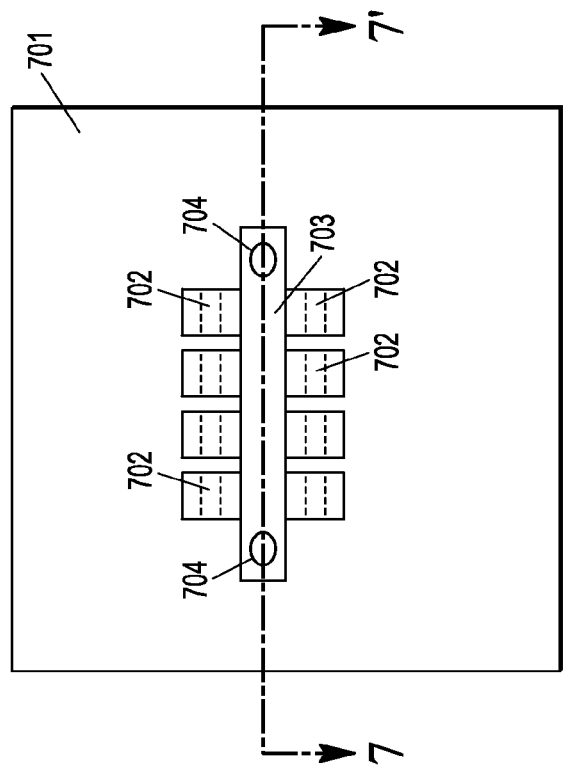
FIG. 7 is a front plan view of a DTM load board.

FIG. 7 is a front plan view of a DTM load board 700 comprising a circuit board 701 to which are mounted test sockets 702 and a DTM load board manifold 703. This particular manifold 703 has two DTM manifold inlet apertures 704 at either end of the manifold 703. As will be apparent to a person skilled in the art, the manifold 703 has passages in communication with passages in the test sockets 702. Therefore, in operation hot air can flow through the DTM manifold inlet apertures 704, into the manifold passages, through the passages in test sockets 702 to thereby heat pins of each device under test (not shown) seated in the test sockets 702. Other features of the load board such as and external coupling are not shown as will be apparent to a person skilled in the art.

Figure 8:
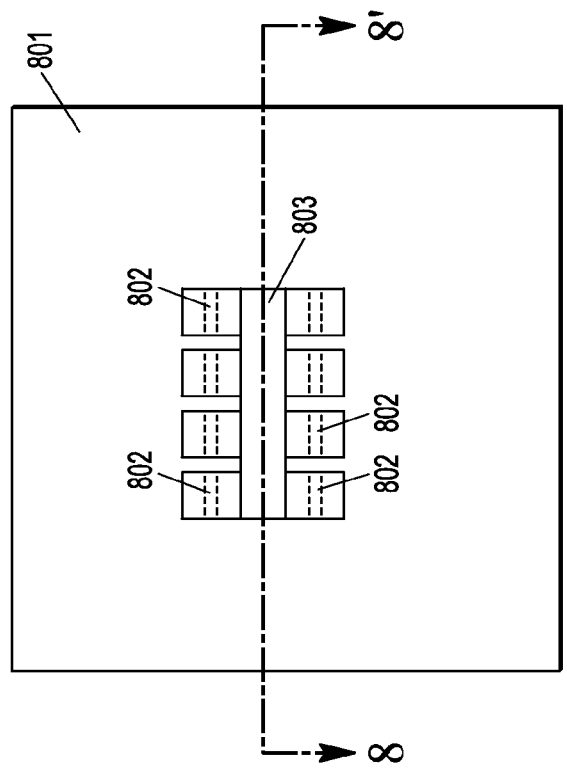
FIG. 8 is a front plan view of a non-DTM load board.

FIG. 8 is a front plan view of a non-DTM load board 800 comprising a circuit board 801 to which are mounted test sockets 802 and a non-DTM load board manifold 803. This particular manifold 803 is a blank or dummy manifold and it is shorter than the DTM manifold 703 and does not have any DTM manifold inlet apertures 704 at either end of the manifold 803. Other features of the load board such as and external coupling are not shown as will be apparent to a person skilled in the art.

Figure 9:
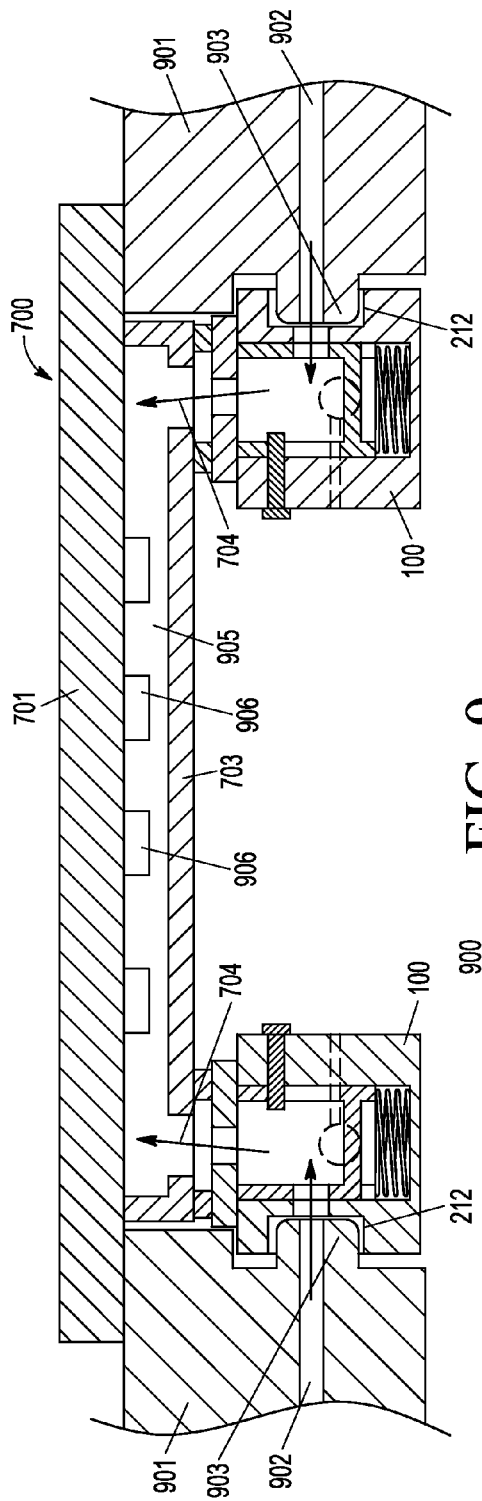
FIG. 9 is a cross-sectional of a test equipment assembly including an inverted view through 7-7' of the DTM load board of FIG. 7 in accordance with an embodiment of the present invention.

Referring to FIG. 9, there is illustrated a cross sectional view of a test equipment assembly 900 including an inverted view through 7-7' of the DTM load board 700 in accordance with an embodiment of the present invention. The test equipment assembly 900 has a test equipment mount 901 with mount air outlet apertures 902 and associated interface engagement spigots 903. The test equipment mount 901 also has clamps (not shown) for attachment of load boards. There are two test equipment manifold interfaces 100 attached to the test equipment mount 901, the two test equipment manifold interfaces 100 are bolted to the test equipment mount 901 and the engagement spigots 903 engage the interface sockets 212.

The DTM load board 700 with a DTM load board manifold 203 is clamped to the test equipment mount 901 and thereby the DTM load board manifold 703 engages the test equipment manifold interfaces 100. As shown the DTM load board manifold 703 actuates the hollow piston 107 thereby directing air to flow from the air inlet aperture 102 to the DTM interface outlet aperture 201 and into the DTM load board manifold 703. More specifically, because the DTM load board manifold 703 engages the manifold interface 100 the manifold abutting end 108 engages the DTM load board manifold 203. This therefore actuates the hollow piston 107 to thereby direct the air to flow from the air inlet aperture 102 to the DTM interface outlet 202, through the DTM manifold inlet apertures 704 and into a manifold passage 905, in the DTM load board manifold 703, and out into test socket passages 906 on the DTM load board 800. Also, when the DTM load board manifold 703 engages the manifold interface the gasket 109 abuts the DTM load board manifold 703 thereby forming an air tight seal.

As shown, the hollow piston is directing hot air from the mount air outlet apertures 902 to flow from the air inlet apertures 102 to the DTM interface outlet apertures and therefore the DTM interface inlet aperture 202 is aligned with the chamber inlet 105.

Figure 10:
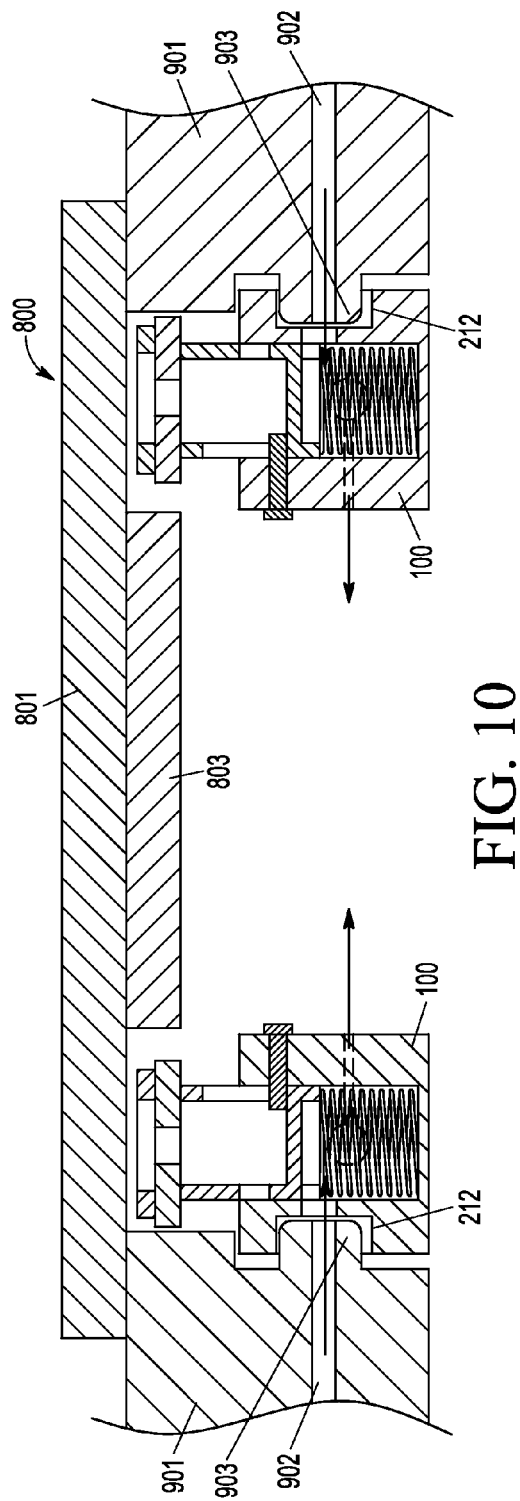
FIG. 10 is a cross-sectional of the test equipment assembly of FIG. 9 including an inverted view through 8-8' of the non-DTM load board of FIG. 8 in accordance with an embodiment of the present invention.

FIG. 10 is a cross-sectional of the test equipment assembly 900 including an inverted view through 8-8' of the non-DTM load board 800 in accordance with an embodiment of the present invention.

The non-DTM load board 800 with is clamped to the test equipment mount 901, however, the non-DTM load board manifold 803 (dummy manifold) does not engage the test equipment manifold interfaces 100. As shown the compression spring 111 urges the hollow pistons 107 to the protruded position and thus the hollow pistons 107 direct air to flow from the air inlet apertures 102 to the outlet apertures 103 and this occurs in this embodiment when the notch 211 is aligned with the chamber inlet 105.

Advantageously, the present invention operates such that when the air inlet aperture 102 is operatively coupled to the mount air outlet aperture 902, the hollow piston 107 provides for selectively directing air from the air inlet aperture 102 to either the DTM interface outlet aperture 201 or the plurality of apertures 103. As such, the present invention provides for a single test equipment manifold interface that can be used for both DTM testing and non-DTM testing.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A test equipment manifold interface, comprising:
   a housing;
   an air inlet aperture in the housing;
   a plurality of outlet apertures in the housing; and
   a chamber located in the housing, the chamber having a chamber inlet provided by the air inlet aperture and a chamber outlet coupled to the plurality of outlet apertures; and
   a hollow piston captive in the chamber, the hollow piston having a DTM interface outlet aperture and a DTM interface inlet aperture,
   wherein in operation when a DTM load board manifold engages the manifold interface the hollow piston directs air to flow from the air inlet aperture to the DTM interface outlet aperture and when the DTM load board manifold disengages the manifold interface the hollow piston directs air to flow from the air inlet to the plurality of outlet apertures via the chamber outlet.

2. The test equipment manifold interface of claim 1, wherein the hollow piston is biased to direct air to the plurality of outlet apertures.

3. The test equipment manifold interface of claim 2, wherein the hollow piston has an manifold abutting end, and wherein when the DTM load board manifold engages the manifold interface the manifold abutting end engages the DTM load board manifold and actuates the hollow piston to thereby direct the air to flow from the air inlet aperture to the DTM interface outlet and into the DTM load board manifold.

4. The test equipment manifold interface of claim 3, wherein there is a gasket attached to the manifold abutting end, and wherein when the DTM load board manifold engages the manifold interface the gasket abuts the DTM load board manifold.

5. The test equipment manifold interface of claim 2, wherein the hollow piston has a piston passage and wherein the DTM interface outlet aperture and DTM interface inlet aperture are operatively coupled together by the piston passage.

6. The test equipment manifold interface of claim 5, wherein the DTM interface outlet aperture is in the manifold abutting end.

7. The test equipment manifold interface of claim 5, wherein the DTM interface inlet aperture is in a side wall of the hollow piston.

8. The test equipment manifold interface of claim 7, wherein there is a notch in the hollow piston, and wherein the notch is aligned with the DTM interface inlet aperture along the axial length of the hollow piston.

9. The test equipment manifold interface of claim 8, wherein when the hollow piston directs air to flow from the air inlet aperture to the DTM interface outlet aperture the DTM interface inlet aperture is aligned with the chamber inlet.

10. The test equipment manifold interface of claim 8, wherein when the hollow piston directs air to flow from the air inlet to the plurality of outlet apertures the notch is aligned with the chamber inlet.

11. A test equipment assembly, comprising:
    a test equipment mount with at least one mount air outlet aperture; and
    at least one test equipment manifold interface coupled to the test equipment mount, the manifold interface including: a housing; an air inlet aperture in the housing; a plurality of outlet apertures in the housing; a chamber located in the housing, the chamber having a chamber inlet provided by the air inlet aperture and a chamber outlet coupled to the plurality of outlet apertures; and
    a hollow piston captive in the chamber, the hollow piston having a DTM interface outlet aperture and a DTM interface inlet aperture,
    wherein the air inlet aperture is operatively coupled to the mount air outlet aperture and in operation the hollow piston provides for selectively directing air from the air inlet aperture to either the DTM interface outlet aperture or the plurality of apertures.

12. The test equipment assembly of claim 11, further including a load board with a DTM load board manifold engaging the test equipment manifold interface, wherein the DTM load board manifold actuates the hollow piston thereby directing air to flow from the air inlet aperture to the DTM interface outlet aperture and into the DTM load board manifold.

13. The test equipment assembly of claim 10, wherein the hollow piston has an manifold abutting end, and wherein when the DTM load board manifold engages the manifold interface the manifold abutting end engages the DTM load board manifold and actuates the hollow piston to thereby direct the air to flow from the air inlet aperture to the DTM interface outlet and into the DTM load board manifold.

14. The test equipment assembly of claim 13, wherein there is a gasket attached to the manifold abutting end, and wherein when the DTM load board manifold engages the manifold interface the gasket abuts the DTM load board manifold.

15. The test equipment assembly of claim 10, wherein the hollow piston has a piston passage and wherein the DTM interface outlet aperture and DTM interface inlet aperture are operatively coupled together by the piston passage.

16. The test equipment assembly of claim 15, wherein the DTM interface outlet aperture is in the manifold abutting end.

17. The test equipment assembly of claim 16, wherein the DTM interface inlet aperture is in a side wall of the hollow piston.

18. The test equipment assembly of claim 17, wherein there is a notch in the hollow piston, and wherein the notch is aligned with the DTM interface inlet aperture along the axial length of the hollow piston.

19. The test equipment assembly of claim 18, wherein when the hollow piston directs air to flow from the air inlet aperture to the DTM interface outlet aperture the DTM interface inlet aperture is aligned with the chamber inlet.

20. The test equipment assembly of claim 18, wherein when the hollow piston directs air to flow from the air inlet aperture to the plurality of outlet apertures the notch is aligned with the chamber inlet.

\* \* \* \* \*